(12) United States Patent
Yamamura et al.

(10) Patent No.: US 6,697,406 B2
(45) Date of Patent: Feb. 24, 2004

(54) SEMICONDUCTOR DEVICE AND PHOTONIC SEMICONDUCTOR DEVICE APPLYING THE SEMICONDUCTOR DEVICE

(75) Inventors: Shin'ichi Yamamura, Tokyo (JP); Kazushige Kawasaki, Tokyo (JP); Yasuaki Yoshida, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 136 days.

(21) Appl. No.: 09/986,035

(22) Filed: Nov. 7, 2001

(65) Prior Publication Data

US 2002/0159492 A1 Oct. 31, 2002

(30) Foreign Application Priority Data

Mar. 2, 2001 (JP) ........................................ 2001-059107

(51) Int. Cl.$^7$ ............................................. H01S 5/227
(52) U.S. Cl. .................................................... 372/46
(58) Field of Search ........................................... 372/46

(56) References Cited

U.S. PATENT DOCUMENTS

| 4,378,255 A | 3/1983 | Holonyak, Jr. et al. |
| 5,577,063 A | 11/1996 | Nagai et al. |
| 6,580,738 B2 * | 6/2003 | Fukunaga ..................... 372/46 |

FOREIGN PATENT DOCUMENTS

JP      8-111560      4/1996

\* cited by examiner

*Primary Examiner*—James Davie
(74) *Attorney, Agent, or Firm*—Leydig, Voit & Mayer, Ltd.

(57) ABSTRACT

A semiconductor device and a photonic semiconductor device are disclosed wherein, if w is the thickness of a metal electrode layer covering a contact layer and current-unfed regions, D denotes the thickness of a plating layer on the metal electrode layer, the boundary between the contact layer and any one of the current-unfed regions is an origin, a direction from the origin into the device interior is a positive direction, and a direction from the origin toward any one of device facets is a negative direction, then a distance d between the origin and each facet of the plating layer satisfies $(d/w)[1-w/(w+D)]<20$.

12 Claims, 6 Drawing Sheets

Distances from laser diode facets ($\mu$m)

Distances from laser diode facets ($\mu$m)

SEMICONDUCTOR DEVICE AND PHOTONIC SEMICONDUCTOR DEVICE APPLYING THE SEMICONDUCTOR DEVICE

BACKGROUND OF THE INVENTION

1. Field of the Invention

The present invention relates to a semiconductor device and a photonic semiconductor device applying the semiconductor device.

2. Description of the Background Art

A major failure of laser diodes is known as an optically caused facet breakdown (COD; catastrophic optical damage). One conventional measure to counter the COD of a laser diode involves including facets with a window structure that will not absorb any laser beam, thus boosting the laser diode in reliability.

The window structure constitutes light-non-absorbing regions interposed between an active layer inside the laser diode and the facets of the laser diode. The light-non-absorbing regions have a wider band gap energy than the active layer in order to eliminate laser beam absorption. The light-non-absorbing regions, along with the active layer, are covered with a cladding layer. The cladding layer, in turn, is topped with a contact layer opposite the active layer and with current-unfed regions opposite the light-non-absorbing regions and contiguous with the contact layer.

The contact layer and current-unfed regions are covered with a metal electrode layer. A plating layer is formed on the metal electrode layer. The plating layer and metal electrode layer introduce carriers into the active layer through the contact layer and cladding layer, triggering laser light emission by the active layer based on its band gap and quantum level. The current-unfed regions are used to forestall current flows from the metal electrode layer into the cladding layer and light-non-absorbing regions underneath. The plating layer serves to facilitate die bonding and wire bonding of the photonic semiconductor device as well as to stabilize and reinforce the bonding of the device.

When laser diodes are cut from a wafer, it is customary to cleave the wafer into the diodes so that each diode will have facets with a mirror surface. In such cases, the plating layer is spaced from the cleaving positions because the plating layer hampers cleavage. On the other hand, the light-non-absorbing regions are contiguous with the laser diode facets to prevent optical damage to the facets. In this structure, the current blocking regions opposite the light-non-absorbing regions are also contiguous with the laser diode facets. As a result, the plating layer is farther inside the laser diode than a boundary between the contact layer and the current-unfed regions on the metal electrode layer. In other words, the plating layer is not located opposite the current-unfed regions.

In the plating layer arrangement outlined above, a disproportionately elevated local density of currents has been observed in the metal electrode layer between a plating layer end and the current-unfed regions. The heightened local current density leads to local heating and device breakdown.

SUMMARY OF THE INVENTION

The present invention has been conceived to solve the previously-mentioned problems and a general object of the present invention is to provide a novel and useful semiconductor device, and is to provide a novel and useful photonic semiconductor device.

A more specific object of the present invention is to prevent localized increases in current density, and is to relieve local heating.

The above object of the present invention is attained by a following semiconductor device and a following photonic semiconductor device.

According to one aspect of the present invention, the semiconductor device comprises: a contact layer; current-unfed regions contiguous with the contact layer; a metal electrode layer coupled both to the contact layer and to each of the current-unfed regions and having a thickness of "w"; and a plating layer which is formed on the metal electrode layer, which has a thickness of "D", and which has facets each located a predetermined distance away from a boundary between the contact layer and each of the current-unfed regions; wherein, if it is assumed that the boundary between the contact layer and any one of the current-unfed regions is taken as an origin, that a direction from the origin toward the any one of the current-unfed regions is a negative direction, and that a direction from the origin toward the contact layer is a positive direction, then the distance "d" between the origin and each of the facets of the plating layer satisfies a relationship of $d/w*[1-w/(w+D)]<20$.

According to another aspect of the present invention, the photonic semiconductor device comprises: an active layer; light-unabsorbing regions contiguous with the active layer; a clad layer covering the active layer and the light-unabsorbing regions; a contact layer located above the clad layer which is on the active layer; current-unfed regions contiguous with the contact layer and over the light-unabsorbing regions; a metal electrode layer covering the contact layer and the current-unfed regions and having a thickness of "w"; and a plating layer which is formed on the metal electrode layer, which has a thickness of "D", and which has facets each located a predetermined distance away from a boundary between the contact layer and each of the current-unfed regions; wherein, if it is assumed that the boundary between the contact layer and any one of the current-unfed regions is taken as an origin, that a direction from the origin toward the any one of the current-unfed regions is a negative direction, and that a direction from the origin toward the contact layer is a positive direction, then the distance "d" between the origin and each of the facets of the plating layer satisfies a relationship of $d/w*[1-w/(w+D)]<20$.

Other objects and further features of the present invention will be apparent from the following detailed description when read in conjunction with the accompanying drawings.

DETAILED DESCRIPTION OF THE PREFERRED EMBODIMENTS

Figure 1:
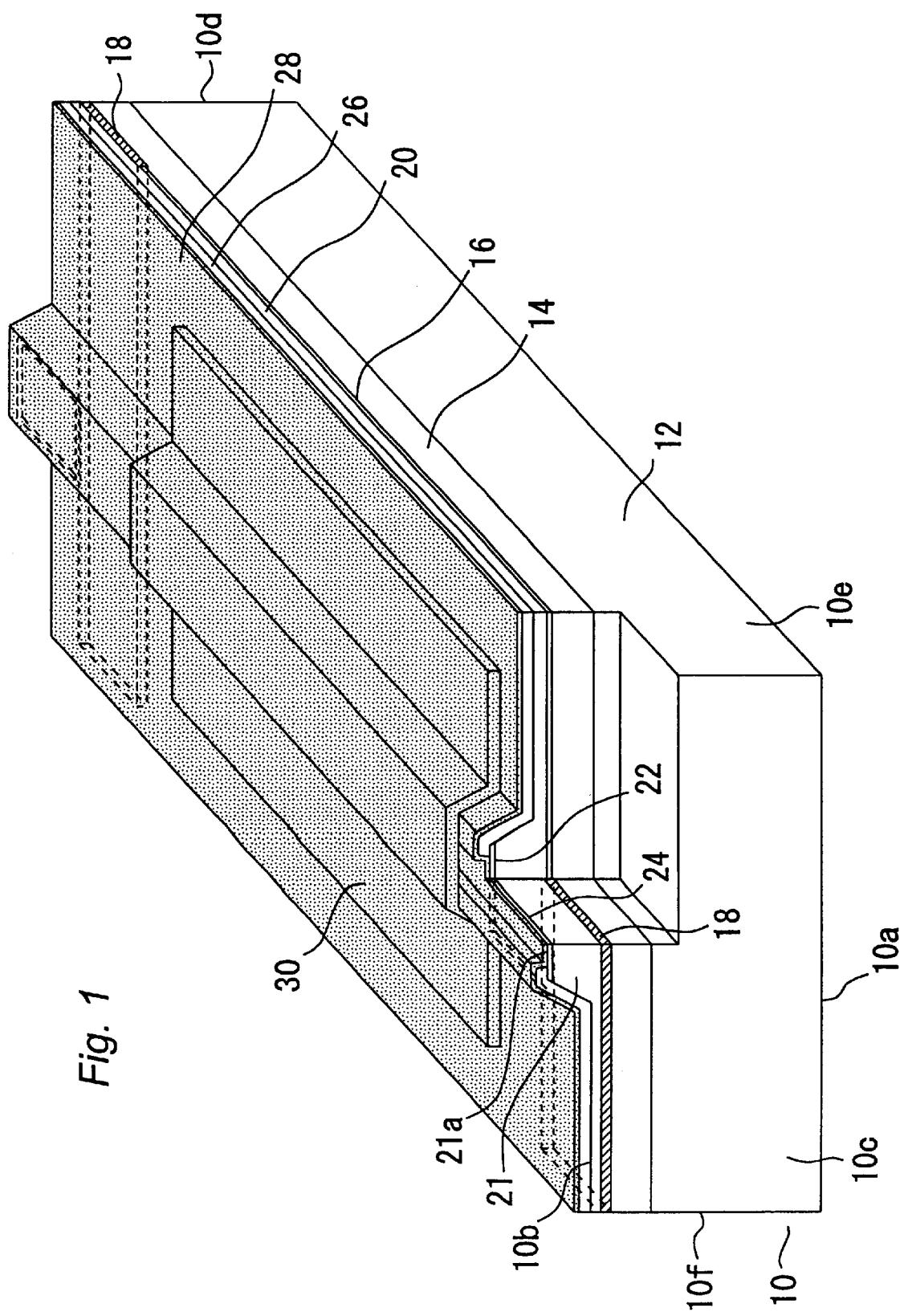
FIG. 1 is a perspective view of a semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

Figure 2:
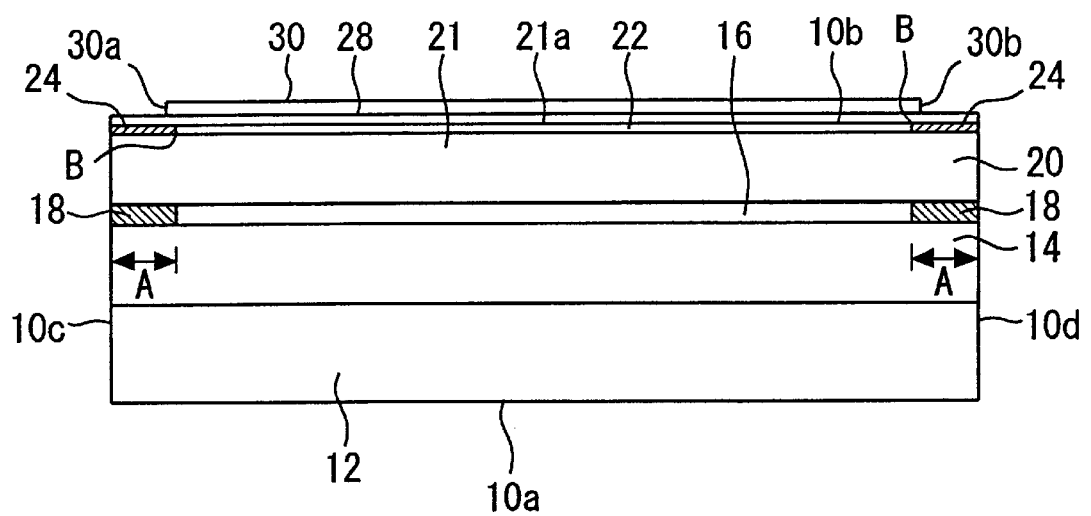
FIG. 2 is a cross-sectional view of the first embodiment.

FIG. 1 is a partially cutaway perspective view of a semiconductor device practiced as the first embodiment of the present invention. FIG. 2 is a cross-sectional view of the first embodiment. This semiconductor device constitutes a ridge waveguide type window structure laser diode 10. The cross-sectional view of FIG. 2 is taken along the ridge waveguide of the device. The laser diode 10 is rectangular in shape and has a flat lower principal plane 10a and an upper principal plane 10b opposite to the plane 10a. A pair of opposing facets 10c and 10d are formed in perpendicular to a ridge waveguide extension. Another pair of opposing facets 10e and 10f are formed in parallel with the ridge waveguide extension. These facets 10c, 10d, 10e and 10f are formed when the wafer is cleaved.

The laser diode 10 comprises: a GaAs substrate 12 constituting the lower principal plane 10a; an n-type AlGaAs (aluminum gallium arsenide) clad layer 14 formed above the entire upper surface of the substrate 12; an active layer 16 formed on the clad layer 14; and light-unabsorbing regions 18. The light-unabsorbing regions 18, as shown in FIG. 2, are formed on the same level as the active layer 16 and located at ends contiguous with the facets 10c and 10d of the laser diode 10. The light-unabsorbing regions 18 are structured to have a wider band gap than the active layer 16. Contiguous with the facets 10c and 10d, the light-unabsorbing regions 18 each having a width of A extend from the facet 10e to the facet 10f.

One method of forming the light-unabsorbing regions 18 is as follows: the active layer 16 is first formed in its own and in a manner constituting regions (target regions) that are to become the light-unabsorbing regions 18. In the regions 18, a quantum well structure of the active layer 16 is disordered so as to turn the layer into a material with a wider band gap than before. In the disordering process, the active layer 16 is treated illustratively in one of three ways: impurities are selectively diffused into the target regions of the layer 16; ions are implanted selectively into the target regions instead of being subjected to selective impurity diffusion, followed by annealing; or the target regions of the active layer 16 are locally stressed instead of being subjected to selective impurity diffusion.

Another method of forming the light-unabsorbing regions 18 involves first forming the active layer 16 in its own right and in a manner constituting regions (target regions) that are to become the light-unabsorbing regions 18. The active layer 16 in the target regions are removed therefrom by etching. The resulting vacancies are filled with a material having a wider band gap than the active layer 16. Alternatively, after the active 16 is formed in the target regions that are to become the light-unabsorbing regions 18, the active layer 16 except the target regions is selectively doped with impurities so as to narrow the effective band gap of the active layer 16.

A p-type AlGaAs (aluminum gallium arsenide) clad layer 20 is formed in a manner covering the top of the active layer 16 and light-unabsorbing regions 18. A ridge waveguide 21 is fabricated in the clad layer 20, raised in strip form over the upper principal plane 10b of the laser diode 10. The clad layer 20 is made thicker in the ridge waveguide 21 than in other portions. A top face 21a of the ridge waveguide 21 in the clad layer 20 comprises a GaAs (gallium arsenide) contact layer 22 and current-unfed regions 24. The periphery of the top face 21a and the sides of the ridge waveguide 21, as well as the upper surface of the clad layer 20 except the ridge waveguide 21, are all covered with an insulating film 26.

As shown in FIG. 2, the current-unfed regions 24 are formed on the top face 21a of the ridge waveguide 21 in a manner contiguous with the facets 10c and 10d of the laser diode 10 and overlapping with the light-unabsorbing regions 18. The current-unfed regions 24 each having a width of A extend from the facets 10c and 10d to inside the ridge waveguide 21 under the top face 21a. The top face 21a of the ridge waveguide 21 except the current-unfed regions 24 is covered with the contact layer 22. A boundary B between each current-unfed region 24 and the contact layer 22 is located approximately at the distance A from the facet 10c or 10d of the laser diode 10 into the ridge waveguide 21.

The upper surface of the insulating film 26 is covered with a metal electrode layer 28 composed primarily of Au (gold). While the periphery of the top face 21a of the ridge waveguide 21 is covered with the insulating film 26, a contact hole in the middle of the top face 21a has no insulating film 26 formed therein. This structure permits the metal electrode layer 28 to have direct contact with the top face 21a of the ridge waveguide 21 through the contact hole. On the top face 21a of the ridge waveguide 21, the metal electrode layer 28 is formed in a manner covering the contact layer 22 and current-unfed regions 24 with contact maintained between the layers and the regions. Namely, the metal electrode layer 28 is connected to the contact layer 22 and current-unfed regions 24. A plating layer 30 made of Au (gold) is formed on the metal electrode layer 28 and connected to the metal electrode layer 28 above and on both sides of the ridge waveguide 21. Although not shown, anode wiring for the laser diode is bonded to the plating layer 30. The wiring permits application of a plate voltage (positive voltage) to the metal electrode layer 28 as well as an anode potential to the clad layer 20 and active layer 16 via the contact layer 22.

A metal electrode layer and a plating layer, although not shown, are formed on the lower principal plane 10a of the laser diode 10 so as to form the cathode of the diode 10. This plating layer allows the laser diode to be die-bonded to a heat-dissipating substrate.

The current-unfed regions 24 substantially block current flows from the metal electrode layer 28 above the regions 24 into the clad layer 20 underneath the regions 24.

The current-unfed regions 24 are formed illustratively by first forming the contact layer 22 in target regions that are to become the current-unfed regions 24. Ions are then implanted into the target regions of the contact layer 22 to form a higher-resistance material therein. Alternatively, it is possible to form the contact layer 22 in the target regions that are to become the current-unfed regions 24 and then remove the contact layer 22 from the target regions 24 by etching so as to let the metal electrode layer 28 have direct contact with the clad layer 20. By the latter method, the p-type AlGaAs clad layer 20 is allowed to have a high ohmic contact with the metal electrode layer 28, which prevents current flows from the metal electrode layer 28 into the clad layer 20.

In another alternative, as described earlier, the current-unfed regions 24 may be fabricated by first forming the contact layer 22 in its own right and in a manner constituting regions that are to become the target regions 24. The contact layer 22 is then removed from the target regions 24 by etching. The resulting vacancies are filled with a current-unfed crystalline material layer (current-blocking layer), an insulation material layer (e.g. insulating film) or a high-resistance crystalline material having a wide band gap.

The plating layer 30 has facets 30a and 30b at both ends. The facets 30a and 30b are in parallel with the facts 10c and 10d of the laser diode 10, and are located a predetermined distance into the diode 10 from its facets 10c and 10d.

Figure 3:
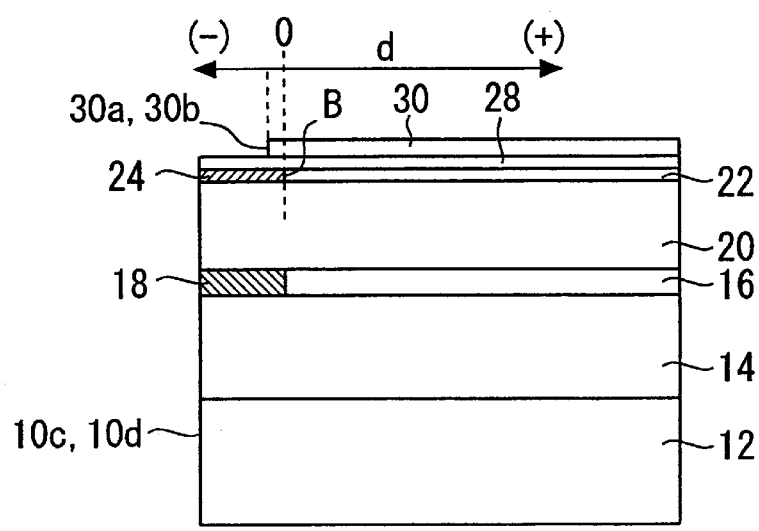
FIG. 3 is a schematic view explaining the positioning of plating layer facets in the first embodiment.

In defining where the facets 30a and 30b of the plating layer 30 are positioned, it is assumed here that an origin "0" exists on a boundary "B" between the contact layer 22 and each current-unfed region 24 in the extending direction of the ridge waveguide 21, i.e., in the direction in which the waveguide intersects perpendicularly the facets 10c and 10d of the laser diode 10; that a distance "d" from the origin 0 to the facet 30a or 30b is deemed positive direction (a plus value) when extending from the origin 0 toward the inside of the laser diode 10, i.e., toward the contact layer 22; and that the distance "d" is deemed negative direction (a minus value) when extending from the origin 0 toward the facet 10c or 10d of the laser diode 10, i.e., toward the current-unfed region 24, as shown in FIG. 3.

Figure 4:
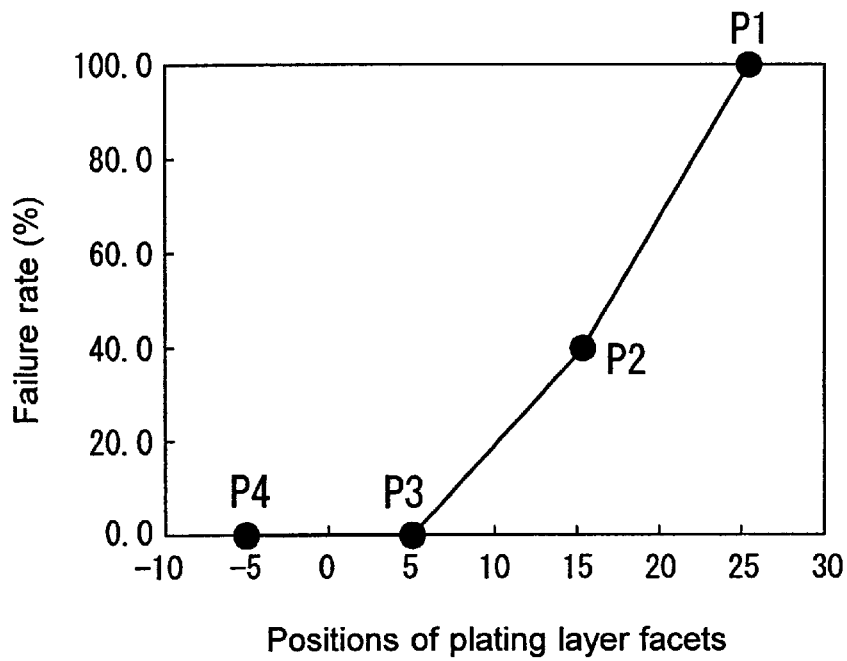
FIG. 4 is a graphic representation showing typical failure rates in effect when the plating facet position is varied in the first embodiment.

FIG. 3 shows a cross-sectional view of an end of the ridge waveguide 21 of the laser diode 10. The facets 10c and 10d of the laser diode 10 are shown overlaid on a single plane, and so are the facets 30a and 30b of the plating layer 30.

Where the positions of the facets 30a and 30b of the plating layer 30 are defined as depicted in FIG. 3, FIG. 4 gives a graphic representation of typical failure rate measurements taken of laser diodes in regard to the positions of the facts 30a and 30b. Specifically, FIG. 4 shows a trend of dependency of the failure rates on the positions of the plating layer facets. The horizontal axis of FIG. 4 represents positions of the facets 30a and 30b of the plating layer 30. The position at the origin 0 applies where the facet 30a or 30b exists immediately above the boundary B. To the right of the origin 0 are distances in which the facets 30a and 30b are shifted in the positive direction; to the left of the origin 0 are distances in which the facets 30a and 30b are shifted in the negative direction. The distances are given in units of micrometers. The vertical axis of FIG. 4 represents percentage points of failure rates regarding laser diodes having the plating layer facets 30a and 30b with their positions indicated on the horizontal axis.

The measurements shown in FIG. 4 were taken under the following conditions: that the metal layer 30 and metal electrode layer 28, each made of Au (gold), are 4.0 micrometers and 0.25 micrometers thick respectively; that the contact layer 22 is made of p-type GaAs (gallium arsenide) and 0.2 micrometers thick; that the clad layer 20 is made of p-type AlGaAs (aluminum gallium arsenide); that the plating layer 30 and metal electrode layer 28 have a specific resistance of $2.4 \times 10^{-6}$ ohm centimeters each; and that the contact layer 22 and clad layer 20 have specific resistances of $6.3 \times 10^{-3}$ ohm centimeters and 0.13 ohm centimeters respectively.

In FIG. 4, laser diodes at a measured point P1, i.e., those with their facets 30a and 30b located plus 25 micrometers from the origin 0, had a failure rate of 100 percent; all laser diodes failed. Laser diodes at a measured point P2, with their facets 30a and 30b located plus 15 micrometers from the origin 0, had a reduced failure rate of 40 percent. Laser diodes at a measured point P3, with their facets 30a and 30b located plus 5 micrometers from the origin 0, as well as diodes with their facets located minus 5 micrometers from the origin 0, had zero failure rate; i.e., none of them failed.

The above data are interpreted as follows: because the contact layer 22 and clad layer 20 have specific resistances several magnitudes higher than the metal electrode layer 28, a boundary face between the metal electrode 28 and the contact layer 22 has a substantially equalized potential. While it is the plating layer 30 that receives power from the outside, that part of the metal electrode layer 28 which is covered with the plating layer 30 has an equalized potential occurring approximately throughout its interior having the low specific resistance in the horizontal direction (X direction) of FIG. 3. But that part of the metal electrode layer 28 which is not covered with the plating layer 30 develops a potential difference horizontally (in the X direction of FIG. 3) because carriers are fed only through the 0.25-micrometer-thick metal electrode layer 28 from the portion covered with the plating layer 30. Here, The part covered with the plating layer 30 and the part not covered therewith both have an equalized potential at the boundary face between the metal electrode layer 28 and the contact layer 22. It follows that, per unit area, the part not covered with the plating layer 30 gets the same amount of carriers as the part covered therewith. As a result, current density is raised locally in the horizontal direction (X direction of FIG. 3) inside those parts of the metal electrode layer 28 which are close to the facets 30a and 30b of the plating layer 30 and which are not covered with the layer 30.

Suppose that the facets 30a and 30b of the plating layer 30 are located as defined in FIG. 3 and that "d" stands for the distance from the origin 0, "w" for the thickness of the metal electrode layer 28, and "D" for the thickness of the plating layer 30. On that assumption, a horizontal current density "Jm" (in the X direction) at the facets 30a and 30b of the plating layer 30 is defined by an expression (1) below using a vertical current density "J" (in the Y direction) in the parts covered with the plating layer 30. The expression (1) is:

$$Jm = J \cdot \frac{d}{w} \cdot \left[1 - \frac{w}{w+D}\right] \quad (1)$$

From the expression (1) above, it will be understood that current density will increase if the distance "d" is not shortened or not shifted in the negative direction, i.e., if the plating layer 30 is not allowed to overlap with the current-unfed regions 24. The boosted current density will likely trigger a localized temperature rise at the facets 30a and 30b of the plating layer 30.

Referring again to FIG. 4, the data at the measured point P1 indicate a more definitive local temperature rise in the tested laser diodes than the data at the measured point P2. Such temperature rises detract dramatically from the reliability of laser diodes. In the laser diodes with the window structure such as the first embodiment, increased current injections do not lead to optically caused facet breakdown (i.e., catastrophic optical damage or COD). However, when currents of up to 1,000 mA exceeding a maximum output limited by temperature rise were made to flow during the testing, no failure occurred in the laser diodes having no localized temperature rise at the measured point P2 in FIG. 4, but all laser diodes that had a local temperature rise at the measured point P1 failed invariably. Failure rates were raised dramatically as the distance "d" of the facet 30a and 30b of the plating layer 30 relative to the origin 0 was increased in the positive direction seen in FIG. 3. These results demonstrate that eliminating the temperature rise necessarily boosts the reliability of laser diodes.

Figure 5:
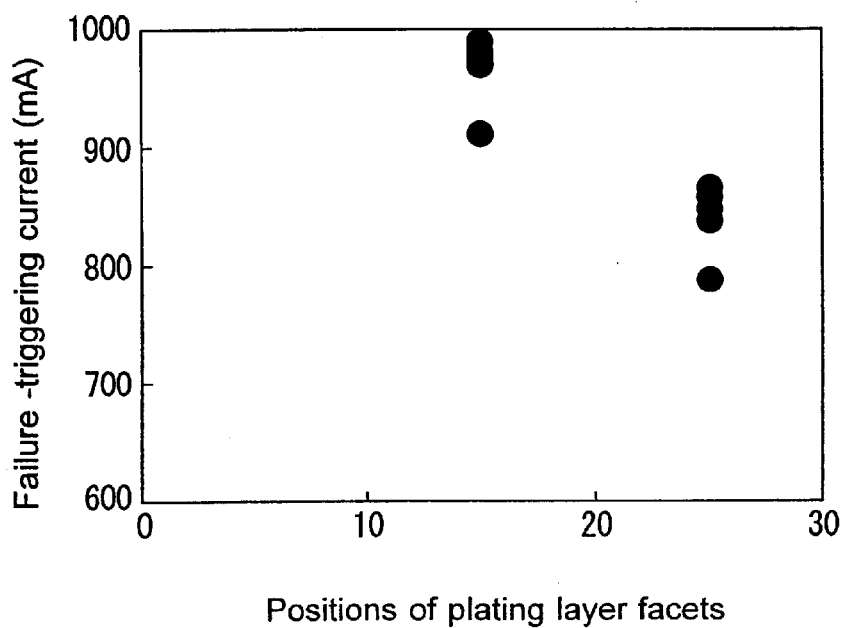
FIG. 5 is a graphic representation indicating failure-triggering current data given when the plating facet position is varied in the first embodiment.

FIG. 5 graphically shows data indicative of failure-triggering currents. The horizontal axis of FIG. 5 represents positive-direction distances "d" (in micrometers) of the facets 30a and 30b of the plating layer 30 relative to the origin 0, and the vertical axis denotes failure-triggering current values (in mA). The data in FIG. 5 indicate that as the distance "d" is increased in the positive direction, failure-triggering currents are on the decrease. In other words, even smaller currents tend to trigger diode failures. These data thus corroborate the expression (1) above.

Figure 6A:
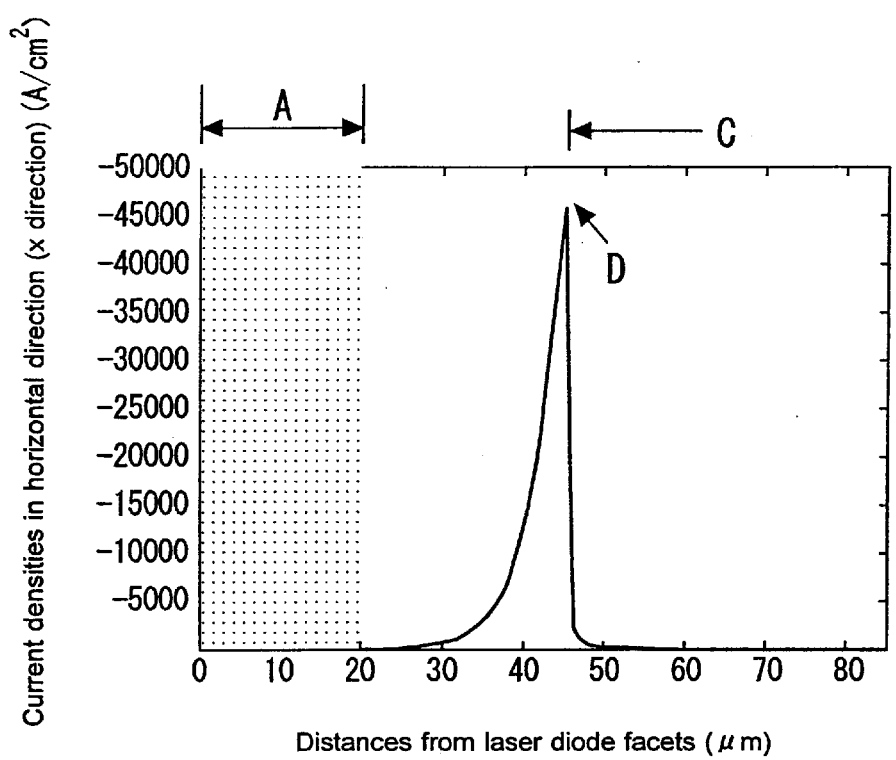
FIGS. 6A and 6B are graphic representations plotting calculated data denoting current density distributions when the plating layer facet position is 25 micrometers in a positive direction.
Figure 6B:
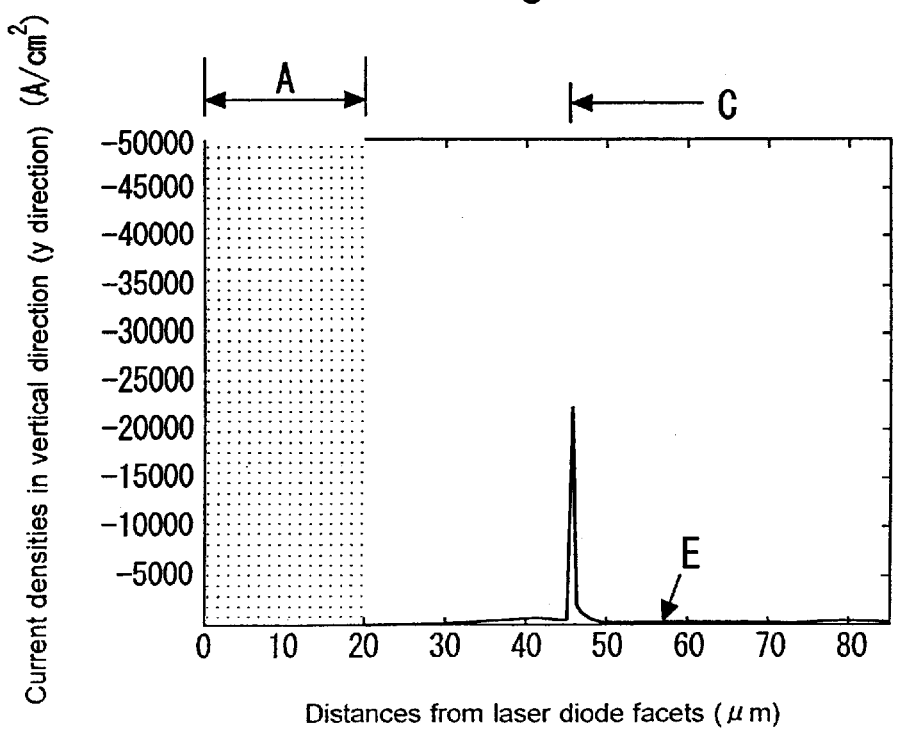

FIGS. 6A and 6B graphically show current density distributions within laser diodes with their distance "d" set plus (i.e., positive-direction) 25 micrometers, the distributions being calculated in a substantially precise manner by use of Poisson's equation based on current continuity. FIG. 6A plots current densities (amperes per square centimeter) in the horizontal direction (X direction) in FIG. 3, and FIG. 6B indicates current densities (amperes per square centimeter) in the vertical direction (Y direction). The horizontal axis in FIGS. 6A and 6B denotes distances between the facet 10c or 10d of the laser diode 10 on the one hand and the facet 30a or 30b of the plating layer 30 on the other hand. The plating layer 30, metal electrode layer 28, contact layer 22, and clad layer 20 are assumed to have the same material compositions, film thicknesses and specific resistances as those stated earlier. The distance A of the current-unfed region 24 relative to the facet 10c or 10d, shown dotted in FIGS. 6A and 6B, is assumed to be 20 micrometers. The region pointed to by an arrow C is where the plating layer 30 exists.

In FIGS. 6A and 6B, the current density is shown extremely boosted horizontally (in the X direction) at the facets 30a and 30b of the plating layer 30. The peak of the current density, which is pointed to by an arrow D, in horizontal direction (x direction) turned out to be about 100 times the average current density, which is pointed to by an arrow E, in the vertical direction (Y direction) under the plating layer 30.

Figure 7A:
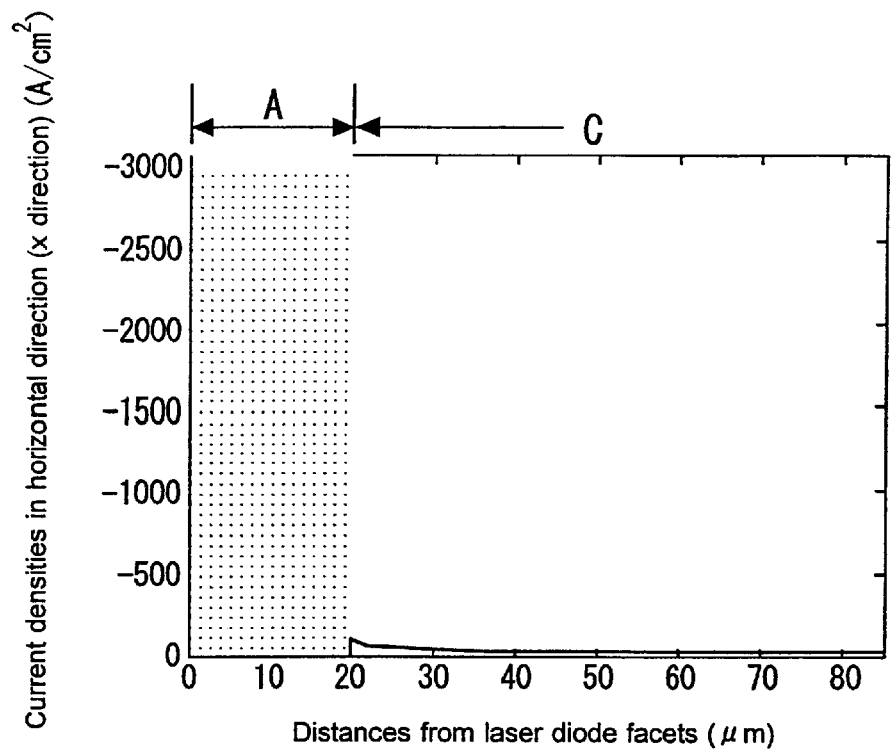
FIGS. 7A and 7B are graphic representations plotting calculated data denoting current density distributions when the plating layer facet position is taken as the origin.
Figure 7B:
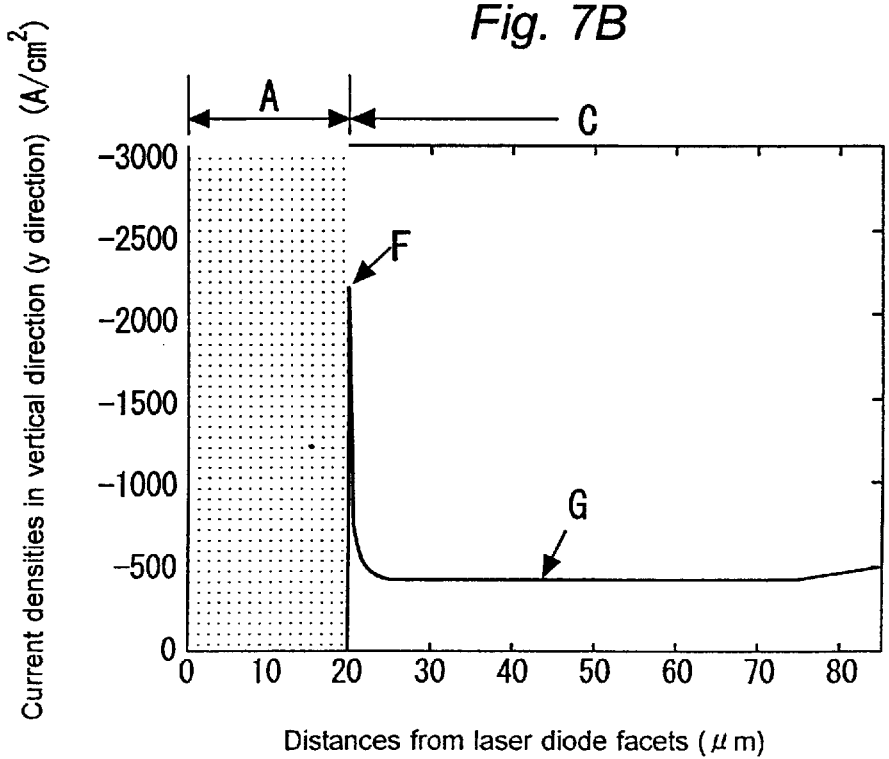

FIGS. 7A and 7B graphically plot current density distributions within laser diodes with their distance "d" set to zero, i.e., with each facet of the plating layer 30 made to coincide with the origin 0, the distributions being calculated in a substantially precise manner by use of Poisson's equation based on current continuity as in FIGS. 6A and 6B. FIG. 7A plots current densities (amperes per square centimeter) in the horizontal direction (X direction) in FIG. 3, and FIG. 7B indicates current densities (amperes per square centimeter) in the vertical direction (Y direction). The horizontal axis in FIGS. 7A and 7B denotes distances between the facet 10c or 10d of the laser diode 10 on the one hand and the facet 30a or 30b of the plating layer 30 on the other hand. The plating layer 30, metal electrode layer 28, contact layer 22, and clad layer 20 are assumed to have the same material compositions, film thicknesses and specific resistances as those stated earlier. The distance A of the current-unfed region 24 relative to the facet 10c or 10d is assumed to be 20 micrometers. The region pointed to by an arrow C is where the plating layer 30 exists.

In FIGS. 7A and 7B, the current density is shown increased but substantially subdued horizontally (in the X direction) at the facets 30a and 30b of the plating layer 30. The peak of the current density, which is pointed to by an arrow F, in the vertical direction (Y direction) at the facets 30a and 30b turned out to be as large as about 4.9 times the average current density, which is pointed to by an arrow G, in the vertical direction (Y direction) under the plating layer 30.

Figure 8A:
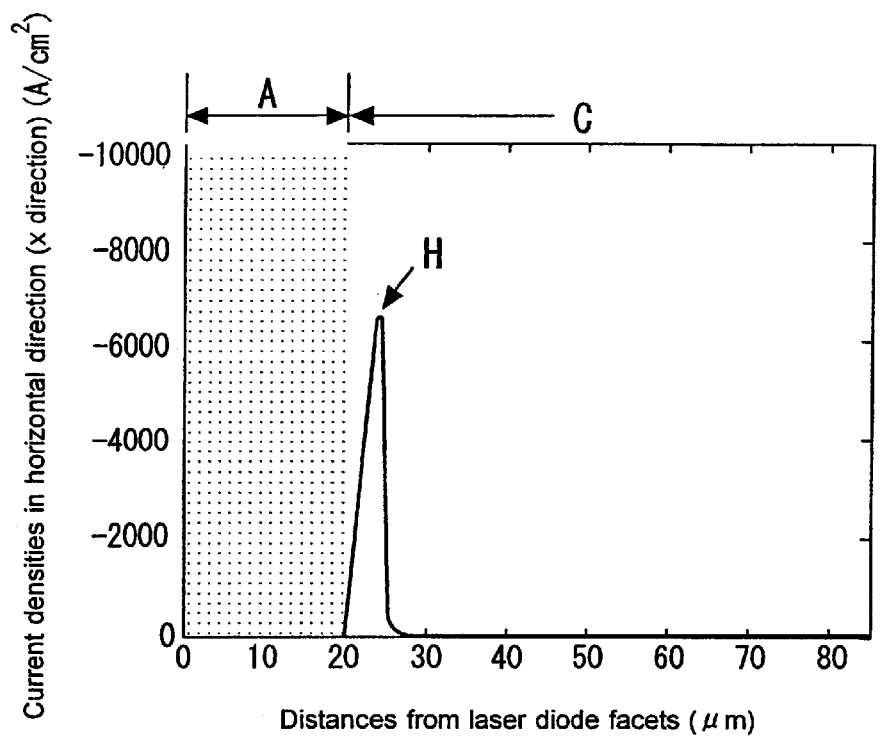
FIGS. 8A and 8B are graphic representations plotting calculated data denoting current density distributions when the plating layer facet position is 5 micrometers in the positive direction.
Figure 8B:
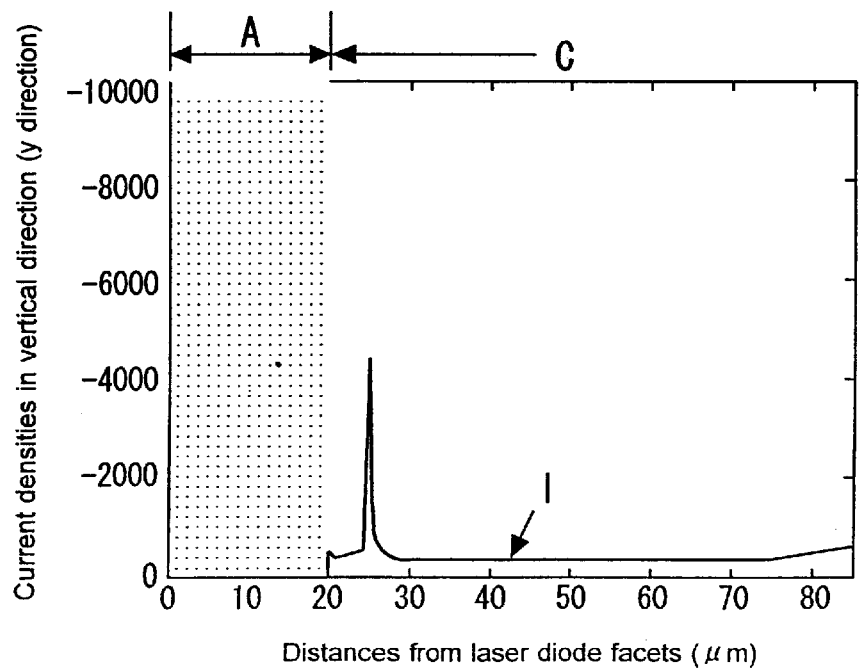

FIGS. 8A and 8B graphically show current density distributions within laser diodes with their distance "d" set to plus 5 micrometers, i.e., with each facet of the plating layer 30 located 5 micrometers in the positive direction away from the origin 0, the distributions being calculated in a substantially precise manner by use of Poisson's equation based on current continuity as in FIGS. 6A and 6B. FIG. 8A plots current densities (amperes per square centimeter) in the horizontal direction (X direction) in FIG. 3, and FIG. 8B indicates current densities (amperes per square centimeter) in the vertical direction (Y direction). The horizontal axis in FIGS. 8A and 8B denotes distances between the facet 10c or 10d of the laser diode 10 on the one hand and the facet 30a or 30b of the plating layer 30 on the other hand. The plating layer 30, metal electrode layer 28, contact layer 22, and clad layer 20 are assumed to have the same material compositions, film thicknesses and specific resistances as those stated earlier. The distance A of the current-unfed region 24 relative to the facet 10c or 10d is assumed to be 20 micrometers. The region pointed to by an arrow C is where the plating layer 30 exists.

In FIGS. 8A and 8B, the current density is shown raised but relatively subdued horizontally (in the X direction) at the facets 30a and 30b of the plating layer 30. The peak of the current density, which is pointed to by an arrow H, in horizontal direction (X direction) turned out to be about 16 times the average current density, which is pointed to by an arrow I, in the vertical direction (Y direction) under the plating layer 30. That degree of current density increase does not adversely affect the reliability of laser diodes.

The data above and strict calculations associated therewith strongly suggest that the failure rate of laser diodes is reduced appreciably if the distance "d" is set in a manner satisfying an expression (2) below. It is assumed here that the distance "d" of the facet 30a or 30b from the origin 0 has a plus sign when established in the positive direction, and is given a minus sign when in the negative direction, that "W" stands for the thickness of the metal electrode layer 28, and that "D" for the thickness of the plating layer 30. The expression (2) is:

$$\frac{d}{w} \cdot \left[1 - \frac{w}{w+D}\right] < 20 \quad (2)$$

If the distance "d" is a negative value in the expression (2) above, then the left side of the expression takes on a negative number. The value is constantly smaller than 20, which contributes to boosting diode reliability. If the distance "d" is a positive value, diode reliability is still enhanced provided the left side of the expression (2) has a value smaller than 20.

Second Embodiment

For the first embodiment above, the active layer 16 was described as composed of InGaAs, the clad layer 20 made of AlGaAs (aluminum gallium arsenide), and the contact layer 22 formed by GaAs (gallium arsenide). Alternatively, these layers may be constituted by any materials selected from the group consisting of GaAs (gallium arsenide), AlGaAs (aluminum gallium arsenide), AlGaInP (aluminum gallium indium phosphorus), GaInNAs (gallium indium nitrogen arsenide), InP (indium phosphorus), InGaAsP (indium gallium arsenide phosphorus), GaN (gallium nitrogen), and InGaN (indium gallium nitrogen).

For the first embodiment, the metal electrode layer and plating layer were described as composed of Au (gold). Alternatively, these layers may be formed by any material selected from the group consisting of Ti (titanium), Pt (platinum), Au (gold), Ni (nickel) and Cr (chromium).

As described, a semiconductor device according to one aspect of the present invention has the facets of its plating layer positioned in a manner satisfying the expression d/w*[1−w/(w+D)]<20. This structure prevents localized increases in current density, forestalling pronounced local heat generation leading to deterioration of device reliability.

Preferably, the semiconductor device may have the distance "d" set for 5 micrometers or less in the positive direction. This structure locates the plating layer sufficiently far from the facets of the semiconductor device so that the wafer may be cleaved more easily than before. The preferred structure also prevents localized increases in current density, thus forestalling pronounced local heat generation leading to deterioration of device reliability.

In other preferred structures of one aspect of the present invention, the semiconductor device may have the distance "d" established in the negative direction or set for minus 5 micrometers (i.e., in the negative direction). These structures unfailingly prevent localized increases in current density, thereby forestalling pronounced local heat generation leading to deterioration of device reliability.

A photonic semiconductor device according to another aspect of the invention has the facets of its plating layer positioned in a manner satisfying the expression d/w*[1−w/(w+D)]<20. This structure prevents localized rises in current density, forestalling pronounced local heat generation leading to deterioration of the photonic semiconductor device in reliability.

Preferably, the active layer, clad layer and contact layer of the inventive photonic semiconductor device may be composed of any materials selected from the group consisting of GaAs, AlGaAs, AlGaInP, GaInNAs, InP, InGaAsP, GaN and InGaN. The metal electrode layer and plating layer of the device may be constituted by any materials selected from the group consisting of Ti, Pt, Au, Ni and Cr. The current-unfed regions of the device may be formed by any one of the following methods: by implanting ions into target regions to make them more resistant, by removing the contact layer from the target regions, by inserting a current-blocking layer into the target regions, by inserting an insulating film into the regions, or by embedding a high-resistance material with a wide band gap. The light-unabsorbing regions may be formed by any one of the following methods: by disordering the active layer, by etching the active layer and replacing it with a material with a wider band gap, or by doping the active layer with impurities. Making use of its characteristics, any one of those materials composed as described may prevent localized rises in current density, thus forestalling pronounced local heat generation leading to deterioration of the photonic semiconductor device in reliability.

Preferably, the photonic semiconductor device may have the distance "d" set for 5 micrometers or less in the positive direction. This structure locates the plating layer sufficiently far from the facets of the semiconductor device so that the wafer may be cleaved more easily than before. The structure also prevents localized increases in current density, thus forestalling pronounced local heat generation leading to deterioration of the photonic semiconductor device in reliability.

In other preferred structures of another aspect of the present invention, the photonic semiconductor device may have the distance "d" established in the negative direction, or set for minus 5 micrometers (i.e., in the negative direction). These structures unfailingly prevent localized increases in current density, thereby forestalling pronounced local heat generation leading to deterioration of the photonic semiconductor device in reliability.

Further, the present invention is not limited to these embodiments, but variations and modifications may be made without departing from the scope of the present invention.

The entire disclosure of Japanese Patent Application No. 2001-059107 filed on Mar. 2, 2001 containing specification, claims, drawings and summary are incorporated herein by reference in its entirety.

What is claimed is:

1. A semiconductor device comprising:
   a contact layer,
   current blocking regions contiguous to and located at opposite ends of said contact layer;
   a metal electrode layer electrically coupled to said contact layer and to each of said current blocking regions and having a thickness w; and
   a plated layer on said metal electrode layer, said plated layer having a thickness D and first and second end faces spaced from respective boundaries between said contact layer and said current blocking regions, wherein, if the boundary between said contact layer and any of said current blocking regions is taken as an origin, a direction from the origin toward any of said current blocking regions is a negative direction, and a direction from the origin toward said contact layer is a positive direction, then the distance d between the origin and each of the end faces of said plated layer satisfies (d/w)[1−w/(w+D)]<20.

2. The semiconductor device according to claim 1, wherein the distance d is no more than 5 micrometers in the positive direction.

3. The semiconductor device according to claim 1, wherein the distance d is in the negative direction.

4. The semiconductor device according to claim 1, wherein the distance d is 5 micrometers in the negative direction.

5. A photonic semiconductor device comprising:
   an active layer in which light is produced;
   window regions contiguous to said active layer and that do not absorb the light produced in said active layer;
   a cladding layer covering said active layer and said window regions;
   a contact layer located on an opposite side of said cladding layer from said active layer;
   current blocking regions contiguous to and located at respective ends of said contact layer and opposite said window regions;
   a metal electrode layer covering said contact layer and said current blocking regions and having a thickness w; and
   a plated layer on said metal electrode layer, said plated layer having a thickness D and end faces spaced from a boundary between said contact layer and each of said current blocking regions, wherein, if the boundary between said contact layer and any of said current blocking regions is taken as an origin, a direction from the origin toward any of said current blocking regions is a negative direction, and a direction from the origin toward said contact layer is a positive direction, then the distance d between the origin and each of the end faces of said plated layer satisfies (d/w)[1−w/(w+D)]<20.

6. The photonic semiconductor device according to claim 5, wherein said cladding layer, said contact layer, and said active layer are each materials selected from the group consisting of GaAs, AlGaAs, AlGaInP, GaInNAs, InP, InGaAsP, GaN, and InGaN.

7. The photonic semiconductor device according to claim 5, wherein said metal electrode layer and said plated layer are each materials selected from the group consisting of Ti, Pt, Au, Ni, and Cr.

8. The photonic semiconductor device according to claim 5, wherein said current blocking regions are formed by one of:

implanting ions into target regions of said contact layer to increase resistivity of said target regions;

removing said contact layer from said target regions so said metal electrode layer directly contacts said cladding layer in said target regions;

forming a current-blocking layer in said target regions from which said contact layer has been removed;

forming an insulating film in said target regions from which said contact layer has been removed; and embedding a material of a higher resistivity than said contact layer in said target regions from which said contact layer has been removed, the material having a wider band gap energy than said contact layer.

9. The photonic semiconductor device according to claim 5, wherein said window regions are formed by one of:

disordering target regions of said active layer;

etching and removing said active layer from said target regions, thereafter introducing a material with a wider band gap energy than said contact layer into said target regions; and doping said target regions of said active layer with impurities.

10. The photonic semiconductor device according to claim 5, wherein the distance d is no more than 5 micrometers in the positive direction.

11. The photonic semiconductor device according to claim 5, wherein the distance d is in the negative direction.

12. The photonic semiconductor device according to claim 5, wherein the distance d is 5 micrometers in the negative direction.

* * * * *